(12) United States Patent
Shin et al.

(10) Patent No.: US 10,308,507 B2
(45) Date of Patent: Jun. 4, 2019

(54) MEMS GAP CONTROL STRUCTURES

(71) Applicant: InvenSense, Inc., San Jose, CA (US)

(72) Inventors: Jong Il Shin, San Jose, CA (US); Peter Smeys, San Jose, CA (US); Bongsang Kim, Mountain View, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 15/298,499

(22) Filed: Oct. 20, 2016

(65) Prior Publication Data

US 2017/0297911 A1 Oct. 19, 2017

Related U.S. Application Data

(60) Provisional application No. 62/247,683, filed on Oct. 28, 2015.

(51) Int. Cl.
*H01L 21/02* (2006.01)
*H01L 29/84* (2006.01)
(Continued)

(52) U.S. Cl.
CPC ........ *B81C 1/00682* (2013.01); *B81B 3/0078* (2013.01); *B81C 1/00333* (2013.01);
(Continued)

(58) Field of Classification Search
CPC ............ B81C 1/00595; B81C 1/00587; B81C 1/00523–1/00571; B81C 1/00388–1/00634; B81C 1/0015; B81C 1/00103; B81C 1/00119; B81C 1/00023–1/00126; B81C 1/00246; B81C 1/0069; B81C 1/00698; B81C 1/0065–1/00682; B81C 1/00055–1/00087;
(Continued)

(56) References Cited

U.S. PATENT DOCUMENTS 7,442,570 B2    10/2008   Nasiri et al.
8,350,346 B1 *   1/2013   Huang ................. B81B 3/0051
                                                 257/414
(Continued)

FOREIGN PATENT DOCUMENTS

TW            201232718 A     8/2012

OTHER PUBLICATIONS

Mems Group et al., "Metal Based Wafer Bonding Techniques for Wafer Level Packaging," Dec. 1, 2009, XP055271501, Retrieved from https://www.suss.com/fileadmin/user_upload/technical_Publications/WP_Metal_Based_Wafer_Bonding_Techniques_for_Wafer_Level_Packaging_1209.pdf. 11 pages.
(Continued)

*Primary Examiner* — Natalia A Gondarenko

(57) ABSTRACT

Provided herein is a method including forming a cavity in a first side of a first silicon wafer. An oxide layer is formed on the first side and in the cavity. The first side of the first silicon wafer is bonded to a first side of a second silicon wafer, and a gap control structure is deposited on a second side of the second silicon wafer. A MEMS structure is formed in the second silicon wafer. The second side of the second silicon wafer is eutecticly bonded to the third silicon wafer, and the eutectic bonding includes pressing the second silicon wafer to the third silicon wafer.

15 Claims, 8 Drawing Sheets

(51) Int. Cl.
*H01L 23/02* (2006.01)
*B81C 1/00* (2006.01)
*B81B 3/00* (2006.01)
*H01L 41/31* (2013.01)
*B81B 7/00* (2006.01)
*B81B 7/02* (2006.01)

(52) U.S. Cl.
CPC ......... *B81B 7/02* (2013.01); *B81C 2203/0118* (2013.01); *B81C 2203/036* (2013.01)

(58) Field of Classification Search
CPC ........ B81C 1/00841–1/00857; B81C 1/00936; B81C 1/00944; B81C 1/00095; B81C 1/00031; B81C 2203/036; B81C 1/00269; B81C 1/00476; B81C 1/00492; B81C 1/00333; B81C 2203/00–2203/0792; B81C 2203/0707–2203/0778; B81C 99/00–99/0095; H01L 29/84; H01L 21/823481; H01L 21/3213; H01L 21/30604; H01L 21/30612; H01L 21/84; H01L 21/762; H01L 21/31111; H01L 21/02178; H01L 21/02532; H01L 21/02592; H01L 21/764; H01L 23/34; H01L 2924/1461; H01L 21/44; H01L 21/70; H01L 2924/15; H01L 2924/151; H01L 2924/1511; H01L 2924/15151; H01L 2924/15153; H01L 2924/153; H01L 2924/15174; H01L 2924/15788; H01L 2924/161; H01L 2924/17151; H01L 23/08; H01L 23/043; H01L 23/41; H01L 23/12; H01L 23/15; H01L 23/32; H01L 41/08; H01L 41/0825; H01L 41/09; H01L 41/094; H01L 41/0973; H01L 41/113; H01L 41/1132; H01L 41/1134; H01L 41/1136; H01L 41/1138; H01L 24/02–24/09; H01L 24/90; H01L 24/80; H01L 29/04; H01L 2224/80001; H01L 2224/80052; H01L 2224/8009; H01L 2224/80091; H01L 2224/80092; B81B 3/0078; B81B 7/02; G01L 19/0084; G01L 19/0092; G02B 6/3552; G02B 6/3594
USPC ................ 257/254, 415, 417, 470, E29.324, 257/E29.347, E21.231, E21.502, E21.002; 438/29, 46, 51, 50, 54, 57, 482, 478, 19, 438/760
See application file for complete search history.

(56) References Cited

U.S. PATENT DOCUMENTS

| | | | |
|---|---|---|---|
| 8,461,017 B2 | 6/2013 | Sadaka et al. | |
| 8,525,278 B2 | 9/2013 | Chu et al. | |
| 8,580,594 B2 | 11/2013 | Huang et al. | |
| 8,790,946 B2 | 7/2014 | Huang et al. | |
| 8,810,027 B2 | 8/2014 | Cheng et al. | |
| 2010/0283144 A1* | 11/2010 | Liang | B81B 7/0077 257/737 |
| 2012/0013013 A1 | 1/2012 | Sadaka et al. | |
| 2012/0074554 A1 | 3/2012 | Cheng et al. | |
| 2012/0326248 A1 | 12/2012 | Daneman et al. | |
| 2013/0037891 A1 | 2/2013 | Huang et al. | |
| 2013/0043547 A1 | 2/2013 | Chu et al. | |
| 2013/0203199 A1 | 8/2013 | Huang et al. | |
| 2015/0151962 A1* | 6/2015 | Mayer | B81C 1/00269 257/415 |
| 2015/0375990 A1* | 12/2015 | Classen | B81B 3/0051 257/415 |
| 2016/0207756 A1* | 7/2016 | Chang | B81B 3/0005 |
| 2016/0233197 A1 | 8/2016 | Smeys et al. | |

OTHER PUBLICATIONS

PCT International Search Report and Written Opinion dated May 20, 2016 in International Application No. PCT/US2016/017418. 16 pages.

* cited by examiner

US 10,308,507 B2

MEMS GAP CONTROL STRUCTURES

CROSS-REFERENCE TO RELATED APPLICATIONS

This application claims the benefit of U.S. Provisional Patent Application Ser. No. 62/247,683 filed Oct. 28, 2015, entitled "GAP CONTROL STRUCTURES".

BACKGROUND

MEMS ("micro-electro-mechanical systems") are a class of devices that are fabricated using semiconductor-like processes and exhibit mechanical characteristics. For example MEMS devices may include the ability to move or deform. In many cases, but not always, MEMS interact with electrical signals. A MEMS device may refer to a semiconductor device that is implemented as a MEMS device. A MEMS device includes mechanical elements and may optionally include electronics (e.g. electronics for sensing). MEMS devices include but are not limited to, for example, gyroscopes, accelerometers, magnetometers, pressure sensors, etc. During fabrication, it may be desirable to create various different MEMS devices on the same wafer. Furthermore, it may be desirable to form the various different MEMS devices with uniform critical gaps.

SUMMARY

Provided herein is a method including forming a cavity in a first side of a first silicon wafer. An oxide layer is formed on the first side and in the cavity. The first side of the first silicon wafer is bonded to a first side of a second silicon wafer, and a gap control structure is deposited on a second side of the second silicon wafer. A MEMS structure is formed in the second silicon wafer. The second side of the second silicon wafer is eutecticly bonded to the third silicon wafer, and the eutectic bonding includes pressing the second silicon wafer to the third silicon wafer.

These and other features and aspects of the concepts described herein may be better understood with reference to the following drawings, description, and appended claims.

DESCRIPTION

Figure 1:
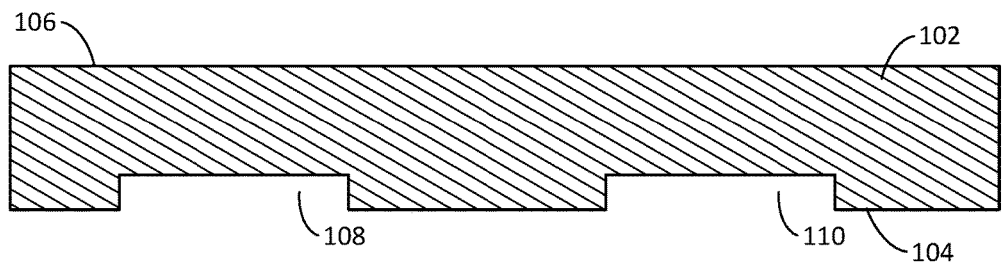
FIG. 1 shows a first substrate including cavities according to one aspect of the present embodiments.

Before various embodiments are described in greater detail, it should be understood by persons having ordinary skill in the art that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing the certain concepts, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "forward," "reverse," "clockwise," "counter clockwise," "up," "down," or other similar terms such as "upper," "lower," "above," "below," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art to which the embodiments pertain.

Various MEMS devices include elements that work best when gaps between various components are within certain desirable ranges. Such desirable gap ranges are predetermined and may be referred to as critical gaps. For example, MEMS pressure sensors may be calibrated with the expectation that a certain critical gap exists between MEMS structures and electrodes on CMOS ("complementary metal-oxide semiconductor") wafers. If the critical gap is outside of expected ranges, then the pressure reading can be inaccurate. MEMS structures other than pressure sensors are also affected by gaps outside of expected critical gap ranges. Therefore, it is desirable to control the critical gap during fabrication.

One of the steps during fabrication of MEMS devices involves the eutectic bonding of the MEMS wafer to the CMOS wafer. During the eutectic bonding process the MEMS wafer and the CMOS wafer are pressed together. If the wafers are not pressed together tightly enough, the eutectic bond may not properly form. On the other hand if the wafers are pressed too tightly, the eutectic bond may properly form, but the critical gap between the two wafers may be too small. Therefore, it is important to control the pressure during eutectic bonding of the MEMS wafer and the CMOS wafer. However, during mass production of many MEMS devices at the same time, pressure control may be difficult to maintain to ensure that each MEMS devices includes both a proper eutectic bond as well as a proper critical gap. As a result, embodiments described herein disclose methods for fabricating MEMS devices with rigid gap control structures, as well as the novel characteristics of the MEMS devices fabricated by the disclosed embodiments. Such gap control structures ensure the proper eutectic bonding of the MEMS devices as well as the proper maintenance of the critical gaps within the MEMS devices.

Referring now to FIG. 1, a first substrate 102 including cavities 108, 110 is shown according to one aspect of the present embodiments. The first substrate 102 may be, for example, a silicon wafer, however it is understood that embodiments are not limited to silicon wafers. The first substrate 102 may also be referred to as a MEMS substrate, handle substrate, cap wafer, handle wafer, etc. The MEMS substrate provides mechanical support for a MEMS structure (see FIG. 6 below). In some embodiments, the MEMS substrate serves as a cap to the MEMS structure.

The first substrate 102 includes a first side 104 and a second side 106. A first cavity 108 and a second cavity 110 are formed in the first side 104 of the first substrate 102. The first cavity 108 and the second cavity 110 may be formed by any suitable fabrication method (e.g. etching, cutting, laser ablation, etc.). In various embodiments, more than two cavities may be formed in the first side 104 of the first substrate 102. It is understood that for simplicity of illustration only two cavities are shown, but any number of cavities may be fabricated on a substrate. In addition, the cavity patterns on the substrate are not limited. For example, cavities may be square, rectangular, oval, circular, irregular, etc.

Figure 2:
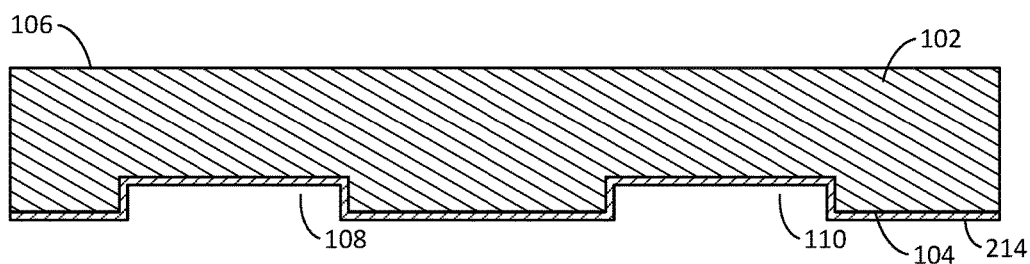
FIG. 2 shows a lining on the first side and the cavities according to one aspect of the present embodiments.

Referring now to FIG. 2, a lining 214 on the first side 104 and the cavities 108, 110 is shown according to one aspect of the present embodiments. The lining 214 is formed over the first side 104 using any suitable fabrication method (e.g. deposition, growth, sputtering, etc.). For example, the lining may be a thermal oxide growth (e.g. silicon dioxide). The lining 214 covers the first side 104, the first cavity 108, and the second cavity 110. In various embodiments, the lining 214 covers only the first side 104 and does not cover the first cavity 108 and the second cavity 110.

Figure 3:
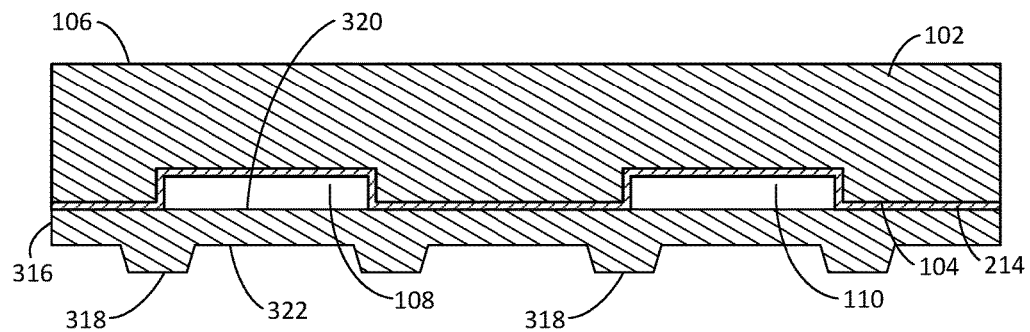
FIG. 3 shows the first substrate fusion bonded to a second substrate including standoffs according to one aspect of the present embodiments.

Referring now to FIG. 3, the first substrate 102 fusion bonded to a second substrate 316 including standoffs 318 is shown according to one aspect of the present embodiments. The second substrate 316 may be, for example, a silicon wafer, however it is understood that embodiments are not limited to silicon wafers. The second substrate 316 is bonded to the first substrate 102. For example, a first side 320 of the second substrate 316 may be fusion bonded to the first side 104 of the first substrate 102, thereby forming a silicon oxide silicon bond. In various embodiments, the second substrate 316 is a structural layer including silicon with MEMS features (e.g. bump stop, damping hole, via, port, plate, proof mass, standoff, spring, seal ring, proof mass, etc.). The MEMS features (not shown, but see FIG. 5) may include one or more moveable elements.

In some embodiments, standoffs 318 are patterned (e.g. etched) on a second side 322 of the second substrate 316. The standoffs 318 help to define the vertical clearance between the structural layer (e.g. the second substrate 316) and an IC substrate (not shown, but see FIG. 6). The standoffs 318 may also provide electrical contact between the structural layer (e.g. the second substrate 316) and the IC substrate (not shown, but see FIG. 6).

Figure 4:
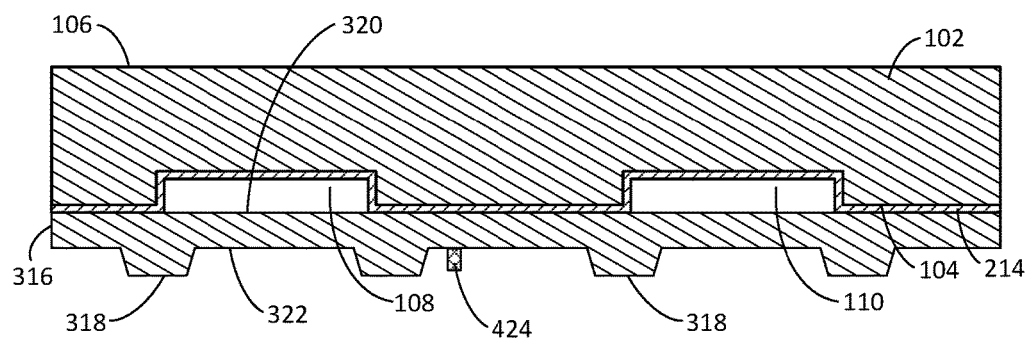
FIG. 4 shows a gap control structure formed on the second side of the second substrate according to one aspect of the present embodiments.

Referring now to FIG. 4, a gap control structure 424 is formed on the second side 322 of the second substrate 316 according to one aspect of the present embodiments. In various embodiments, the gap control structure 424 may include, for example, silicon, silicon nitride, or silicon dioxide. It is understood that these are non-limiting examples, and the gap control structure 424 may include other elements or compounds that to form a rigid structure. The gap control structure 424 may be formed, for example, through deposition, patterning, growth, or other manufacturing processes.

It is understood that the drawings include figurative representations of the gap control structure 424. Therefore in various embodiments, the gap control structure 424 may be longer, shorter, or equal to the length of one or more of the standoffs 318. In some embodiments, the gap control structure may be wider, narrower, or equal to the width of one or more of the standoffs 318. In further embodiments, the gap control structure 424 may be any shape, including for example, square, rectangular, oval, circular, irregular, etc.

Figure 5:
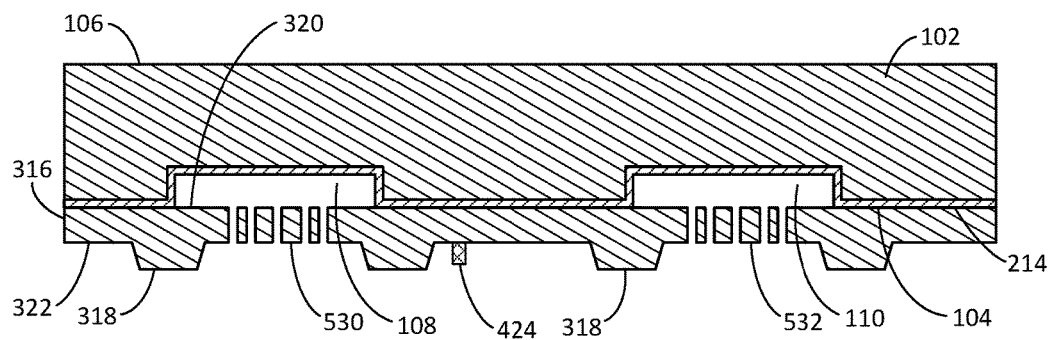
FIG. 5 shows the formation of MEMS features in the second substrate according to one aspect of the present embodiments.

Referring now to FIG. 5, the formation of MEMS features 530, 532 in the second substrate 416 is shown according to one aspect of the present embodiments. First MEMS features 530 and second MEMS features 532 are formed in the second substrate 416 using any suitable fabrication method or combinations of methods. Fabrication processes and methods may include, but are not limited to, etching, cutting, laser ablation, deposition, growth, sputtering, etc. The MEMS features 530, 532 refer to elements formed by such MEMS fabrication processes such as bump stop, damping hole, via, port, plate, proof mass, spring, and other such MEMS features.

Figure 6:
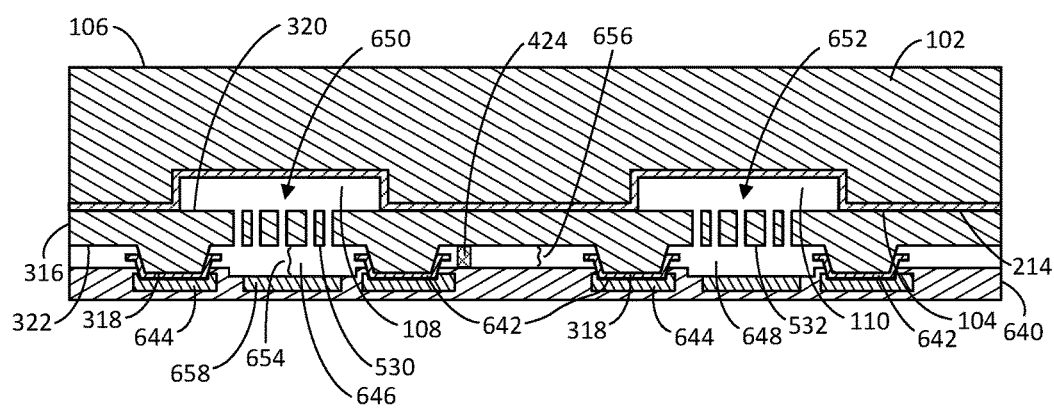
FIG. 6 shows the eutectic bonding of the second substrate to a third substrate according to one aspect of the present embodiments.

Referring now to FIG. 6, the eutectic bonding of the second substrate 316 to a third substrate 640 is shown according to one aspect of the present embodiments. The third substrate 640 may be, for example, a silicon wafer, however it is understood that embodiments are not limited to silicon wafers. The second side 322 of the second substrate 316 has been eutecticly bonded to the third substrate 640. For example, in some embodiments the standoffs 318 form a eutectic bond 642 with bond pads 644 on the third substrate 640, thereby electrically connecting the second substrate 316 and the third substrate 640.

In various embodiments, the eutectic bond 642 is an aluminum-germanium (AlGe) bond as described in U.S. Pat. No. 7,442,570, the contents of which are incorporated herein by reference. In other embodiments, the eutectic bond 642 can be formed, for example, by gold-indium, copper-tin, gold-tin, gold-germanium, gold-silicon, or aluminum-silicon. It is understood that the eutectic bonding elements listed is merely exemplary, and any combination of elements that form a eutectic bond may be used. In some embodiments, the third substrate 640 is an integrated circuit ("IC") substrate. An IC substrate may refer to a silicon substrate with electrical circuits, for example CMOS ("complementary metal-oxide semiconductor") electrical circuits.

During the eutectic bonding the second substrate 316 is pressed to the third substrate 640. It is understood that such pressing may also be done by pressing the third substrate 640 to the second substrate 316 or by pressing together both the second substrate 316 (e.g. structural layer) and the third substrate 640 (e.g. IC substrate). In various embodiments, the pressing of the second substrate 316 and/or the third substrate 640 is uneven across the surface of the wafer(s).

During the pressing the gap control structure 424 prevents a narrowing of a gap 654, 656 (e.g. a critical gap) beyond the gap control structure 424. As such, the gap control structure 424 sets the size of the gap and maintains a predetermined spacing. In order to maintain a predetermined gap, in some embodiments, the gap control structure 424 contacts a rigid portion of the IC substrate (e.g. the third substrate 640). Such rigid portions may be for example portions of the silicon wafer of the third substrate 640 or structures formed on the third substrate 640.

In various embodiments, the gap may be defined as the gap 656 between the second substrate 316 and the third substrate 640. In some embodiments, the gap may be defined as the gap 654 between a MEMS structure (e.g. the MEMS features 530) and an electrode 658 on an IC substrate (e.g. the third substrate 640). In such embodiments, the gap control structure 424 determines a distance between the MEMS features 530 and the electrode 658.

In some embodiments, the standoffs 318 and the third substrate 522 define a first lower cavity 646 and a second lower cavity 648. In various embodiments, the standoffs 318 and the eutectic bonds 642 provide a seal that defines a first enclosure 650 and a second enclosure 652. In various embodiments, the enclosure may refer to a fully enclosed volume typically surrounding the MEMS structure and typically formed by the IC substrate, structural layer, MEMS substrate, and the standoff seal ring. For example in the illustrated embodiment, the first enclosure 650 refers to the fully enclosed volume surrounding the first MEMS features 530, including the first cavity 108 and the first lower cavity 646. In addition, the second enclosure 652 refers to the fully enclosed volume surrounding the second MEMS features 532, including the second cavity 110 and the second lower cavity 648.

In some embodiments, the seal formed by the eutectic bonds 642 may be a hermetic seal. In the illustrated embodiment, the gap control structure 424 is shown outside the hermetic seal of the eutectic bonds 642. However in other embodiments, the gap control structure 424 may be inside the hermetic seal (see FIG. 11). In further embodiments, several gap control structures may be both inside and outside of the hermetic seal. As such, in various embodiments the gap control structure 424 may be inside the gap 654 or the gap 656. In some embodiments, the gap control structure 424 may be outside the gap 654 or the gap 656.

In some embodiments, the first substrate 102 (e.g. handle substrate) is not used. In such embodiments, the steps described above are still applied without the elements involving the first substrate 102.

FIGS. 1-6 illustrated embodiments wherein the gap control structure is a separate structure that is formed on the second wafer. FIGS. 7-11 will illustrate embodiments wherein the gap control structure is formed from the second wafer. As a result, the gap control structure and the second wafer are a single continuous component of the same material.

Figure 7:
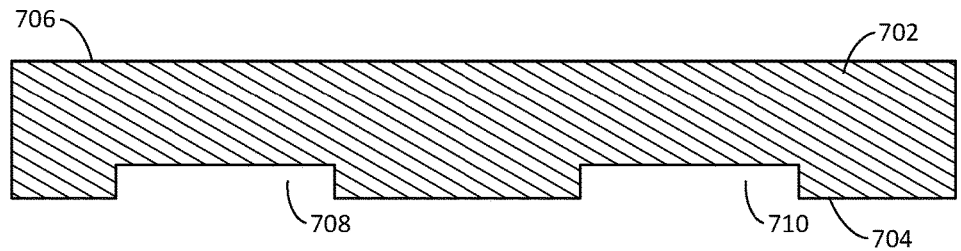
FIG. 7 shows a first substrate including cavities according to one aspect of the present embodiments.

Referring now to FIG. 7, a first substrate 702 including cavities 708, 710 is shown according to one aspect of the present embodiments. The first substrate 702 may be, for example, a silicon wafer, however it is understood that embodiments are not limited to silicon wafers. The first substrate 702 may also be referred to as a MEMS substrate, handle substrate, cap wafer, handle wafer, etc. The MEMS substrate provides mechanical support for a MEMS structure (see FIG. 6 above). In some embodiments, the MEMS substrate serves as a cap to the MEMS structure.

The first substrate 702 includes a first side 704 and a second side 706. A first cavity 708 and a second cavity 710 are formed in the first side 704 of the first substrate 702. The first cavity 708 and the second cavity 710 may be formed by any suitable fabrication method (e.g. etching, cutting, laser ablation, etc.). In various embodiments, more than two cavities may be formed in the first side 704 of the first substrate 702. It is understood that for simplicity of illustration only two cavities are shown, but any number of cavities may be fabricated on a substrate. In addition, the cavity patterns on the substrate are not limited. For example, cavities may be square, rectangular, oval, circular, irregular, etc.

Figure 8:
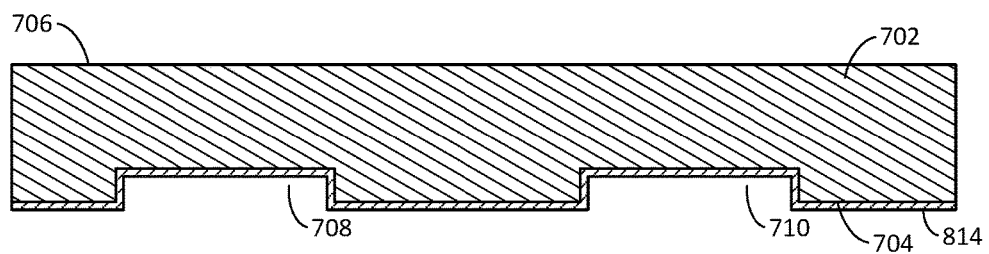
FIG. 8 shows a lining on the first side and the cavities according to one aspect of the present embodiments.

Referring now to FIG. 8, a lining 814 on the first side 704 and the cavities 708, 710 is shown according to one aspect of the present embodiments. The lining 814 is formed over the first side 704 using any suitable fabrication method (e.g. deposition, growth, sputtering, etc.). For example, the lining may be a thermal oxide growth (e.g. silicon dioxide). The lining 814 covers the first side 704, the first cavity 708, and the second cavity 710.

Figure 9:
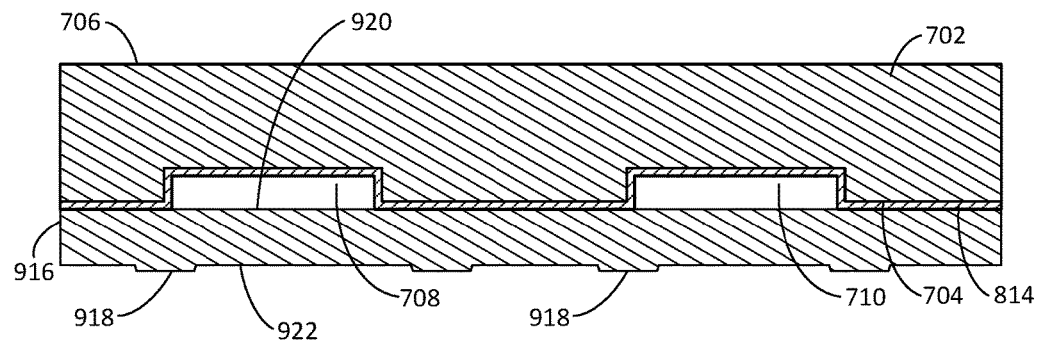
FIG. 9 shows the first substrate fusion bonded to a second substrate including standoffs according to one aspect of the present embodiments.

Referring now to FIG. 9, the first substrate 702 fusion bonded to a second substrate 916 including standoffs 918 is shown according to one aspect of the present embodiments. The second substrate 916 may be, for example, a silicon wafer, however it is understood that embodiments are not limited to silicon wafers. The second substrate 916 is bonded to the first substrate 702. For example, a first side 920 of the second substrate 916 may be fusion bonded to the first side 704 of the first substrate 702, thereby forming a silicon oxide silicon bond. In various embodiments, the second substrate 916 is a structural layer including silicon with MEMS features (e.g. bump stop, damping hole, via, port, plate, proof mass, standoff, spring, seal ring, proof mass, etc.). The MEMS features (not shown, but see FIG. 11 may include one or more moveable elements.

In some embodiments, standoffs 918 are patterned (e.g. etched) on a second side 922 of the second substrate 916. The standoffs 918 help to define the vertical clearance between the structural layer (e.g. the second substrate 916) and an IC substrate (not shown, but see FIG. 11). The standoffs 918 may also provide electrical contact between the structural layer (e.g. the second substrate 916) and the IC substrate (not shown, but see FIG. 11).

Figure 10:
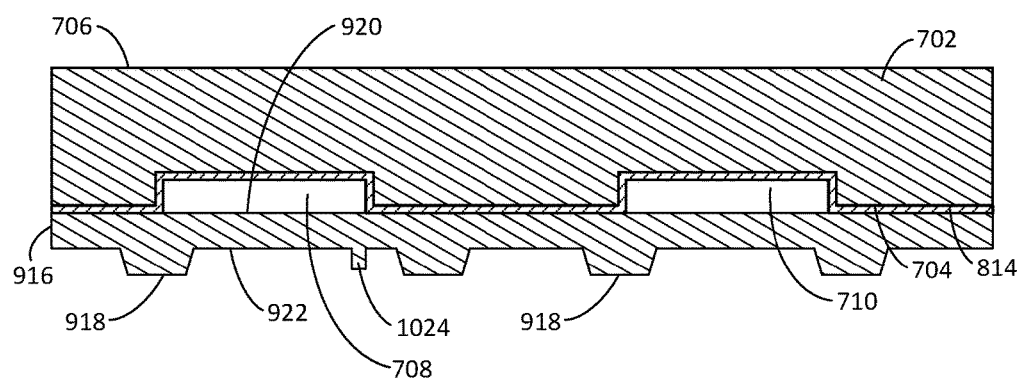
FIG. 10 shows a gap control structure formed on the second side of the second substrate according to one aspect of the present embodiments.

Referring now to FIG. 10, a gap control structure 1024 is formed on the second side 922 of the second substrate 916 according to one aspect of the present embodiments. In various embodiments, the gap control structure 1024 is formed from the second substrate 916 by, for example, etching or other suitable process. As a result, the gap control structure 1024 and the second substrate 916 are a single continuous component. Therefore, the gap control structure 1024 and the second substrate 916 are rigid structures of the same material. In other embodiments, the standoffs 918 are further defined (e.g. enlarged, shaped, lengthened, widened, etc.) during the process of forming the gap control structure 1024 through the further etching of the second substrate 916.

In further embodiments, the gap control structure 1024 may be formed by a separate etch of one or more of the standoffs 918.

It is understood that the drawings include figurative representations of the gap control structure 1024. Therefore in various embodiments, the gap control structure 1024 may be longer, shorter, or equal to the length of one or more of the standoffs 918. In some embodiments, the gap control structure may be wider, narrower, or equal to the width of one or more of the standoffs 918. In further embodiments, the gap control structure 1024 may be any shape, including for example, square, rectangular, oval, circular, irregular, etc.

Figure 11:
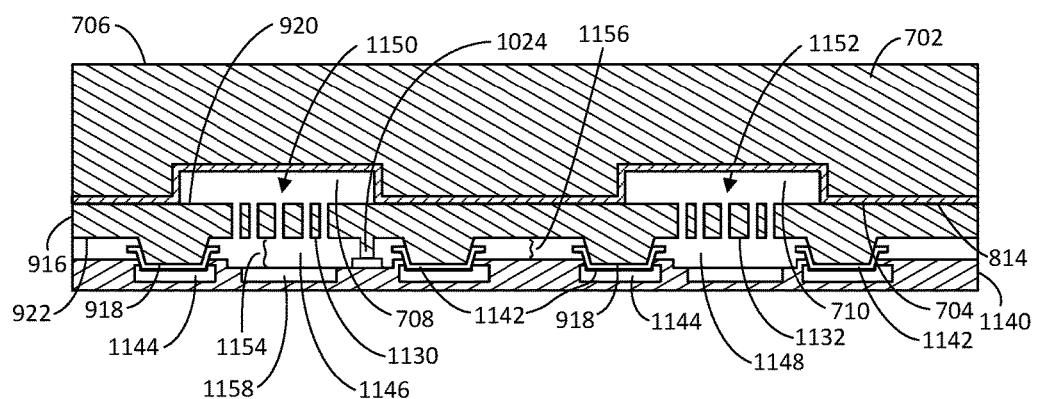
FIG. 11 shows the formation of MEMS features in the second substrate as well as the eutectic bonding of the second substrate to a third substrate according to one aspect of the present embodiments.

Referring now to FIG. 11, the formation of MEMS features 1130, 1132 in the second substrate 916 as well as the eutectic bonding of the second substrate 916 to a third substrate 1140 are shown according to one aspect of the present embodiments. First MEMS features 1130 and second MEMS features 1132 are formed in the second substrate 916 using any suitable fabrication method or combinations of methods. Fabrication processes and methods may include, but are not limited to, etching, cutting, laser ablation, deposition, growth, sputtering, etc. The MEMS features 1130, 1132 refer to elements formed by such MEMS fabrication processes such as bump stop, damping hole, via, port, plate, proof mass, spring, and other such MEMS features.

The second side 922 of the second substrate 916 has been eutecticly bonded to the third substrate 1140. For example, in some embodiments the standoffs 918 form a eutectic bond 1142 with bond pads 1144 on the third substrate 1140, thereby electrically connecting the second substrate 916 and the third substrate 1140. The third substrate 1140 may be, for example, a silicon wafer, however it is understood that embodiments are not limited to silicon wafers.

In various embodiments, the eutectic bond 1142 is an aluminum-germanium (AlGe) bond as described in U.S. Pat. No. 7,442,570, the contents of which are incorporated herein by reference. In other embodiments, the eutectic bond 1142 can be formed, for example, by gold-indium, copper-tin, gold-tin, gold-germanium, gold-silicon, or aluminum-silicon. It is understood that the eutectic bonding elements listed is merely exemplary, and any combination of elements that form a eutectic bond may be used. In some embodiments, the third substrate 1140 is an integrated circuit ("IC") substrate. An IC substrate may refer to a silicon substrate with electrical circuits, for example CMOS ("complementary metal-oxide semiconductor") electrical circuits.

During the eutectic bonding the second substrate 916 is pressed to the third substrate 1140. It is understood that such pressing may also be done by pressing the third substrate 1140 to the second substrate 916 or by pressing together both the second substrate 916 (e.g. structural layer) and the third substrate 1140 (e.g. IC substrate). In various embodiments, the pressing of the second substrate 916 and/or the third substrate 1140 is uneven across the surface of the wafer(s).

During the pressing the gap control structure 1024 prevents a narrowing of a gap 1154, 1156 (e.g. a critical gap) beyond the gap control structure 1024. As such, the gap control structure 1024 sets the size of the gap and maintains a predetermined spacing. In order to maintain a predetermined gap, in some embodiments, the gap control structure 1024 contacts a rigid portion of the IC substrate (e.g. the third substrate 1140). Such rigid portions may be for example portions of the silicon wafer of the third substrate 1140 or structures formed on the third substrate 1140.

In various embodiments, the gap may be defined as the gap 1156 between the second substrate 916 and the third substrate 1140. In some embodiments, the gap may be defined as the gap 1154 between a MEMS structure (e.g. the MEMS features 1130) and an electrode 1158 on an IC substrate (e.g. the third substrate 1140). In such embodiments, the gap control structure 1024 determines a distance between the MEMS features 1130 and the electrode 1158.

In some embodiments, the standoffs 918 and the third substrate 1122 define a first lower cavity 1146 and a second lower cavity 1148. In various embodiments, the standoffs 918 and the eutectic bonds 1142 provide a seal that defines a first enclosure 1150 and a second enclosure 1152. In various embodiments, the enclosure may refer to a fully enclosed volume typically surrounding the MEMS structure and typically formed by the IC substrate, structural layer, MEMS substrate, and the standoff seal ring. For example in the illustrated embodiment, the first enclosure 1150 refers to the fully enclosed volume surrounding the first MEMS features 1130, including the first cavity 708 and the first lower cavity 1146. In addition, the second enclosure 1152 refers to the fully enclosed volume surrounding the second MEMS features 1132, including the second cavity 710 and the second lower cavity 1148.

In some embodiments, the seal formed by the eutectic bonds 1142 may be a hermetic seal. In the illustrated embodiment, the gap control structure 1024 is shown inside the hermetic seal of the eutectic bonds 1142. However in other embodiments, the gap control structure 1024 may be outside the hermetic seal (see FIG. 6). In further embodiments, several gap control structures may be both inside and outside of the hermetic seal. As such, in various embodiments the gap control structure 1024 may be inside the gap 1154 or the gap 1156. In some embodiments, the gap control structure 1024 may be outside the gap 1154 or the gap 1156.

In some embodiments, the first substrate 702 (e.g. handle substrate) is not used. In such embodiments, the steps described above are still applied without the elements involving the first substrate 702.

Figure 12:
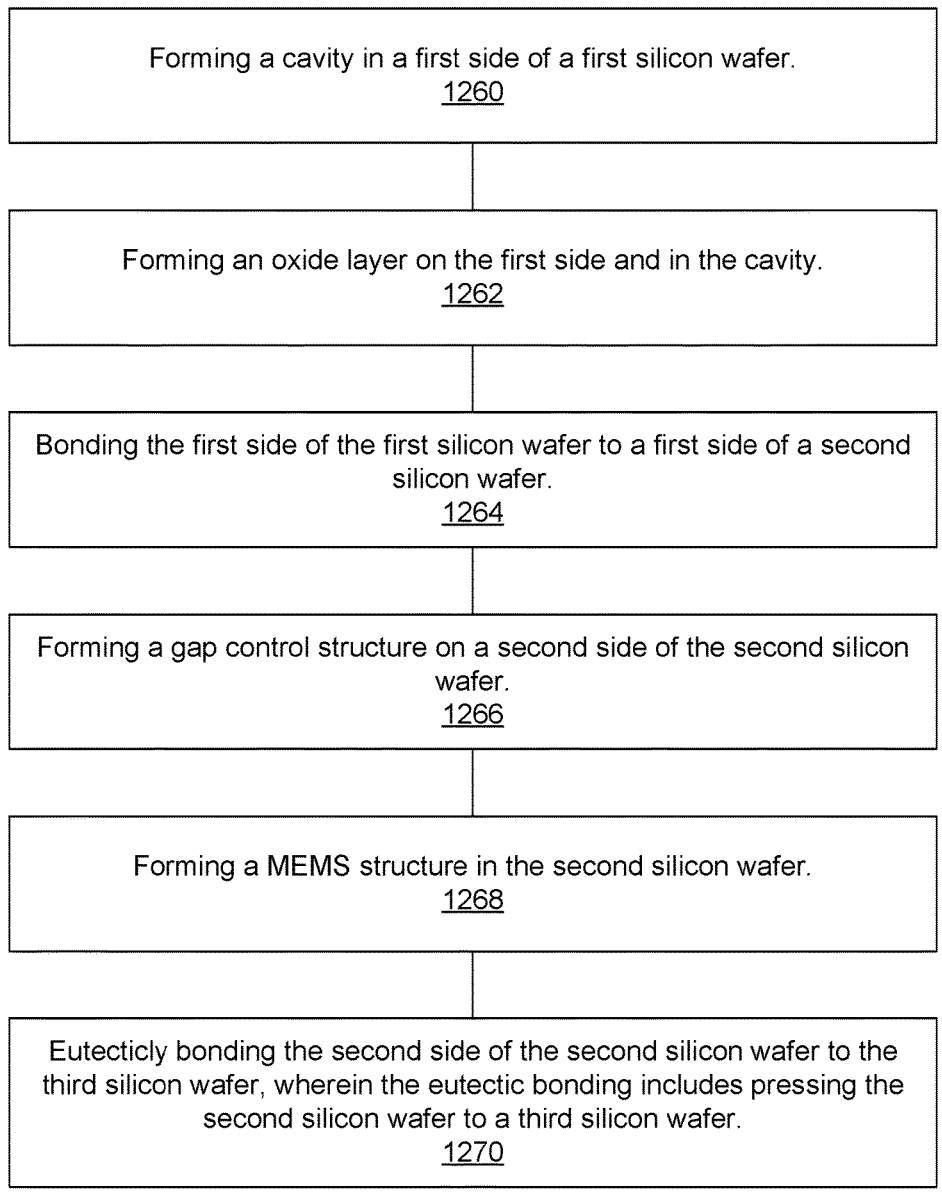
FIG. 12 shows an exemplary flow diagram for forming a gap control structure on a second side of a second silicon wafer according to one aspect of the present embodiments.

FIG. 12 an exemplary flow diagram for forming a gap control structure on a second side of a second silicon wafer is shown according to one aspect of the present embodiments. At a block 1260, a cavity is formed in a first side of a first silicon wafer. For example, in FIG. 1 the first substrate 102 includes a first side 104 and a second side 106. A first cavity 108 and a second cavity 110 are formed in the first side 104 of the first substrate 102. The first cavity 108 and the second cavity 110 may be formed by any suitable fabrication method (e.g. etching, cutting, laser ablation, etc.).

At a block 1262, an oxide layer is formed on the first side and in the cavity. For example, in FIG. 2 the lining 214 is formed over the first side 104 using any suitable fabrication method (e.g. deposition, growth, sputtering, etc.). For example, the lining may be a thermal oxide growth (e.g. silicon dioxide). The lining 214 covers the first side 104, the first cavity 108, and the second cavity 110.

At a block 1264, the first side of the first silicon wafer is bonded to a first side of a second silicon wafer. For example, in FIG. 3 a first side 320 of the second substrate 316 may be fusion bonded to the first side 104 of the first substrate 102, thereby forming a silicon oxide silicon bond.

At a block 1266, a gap control structure is formed on a second side of the second silicon wafer. For example, in FIG. 4 a gap control structure 424 is formed on the second side 322 of the second substrate 316. The gap control structure 424 may be formed, for example, through deposition, patterning, growth, or other manufacturing processes.

At a block 1268, a MEMS structure is formed in the second silicon wafer. For example, In FIG. 5 first MEMS features 530 and second MEMS features 532 are formed in the second substrate 416 using any suitable fabrication method or combinations of methods.

At a block 1270, the second side of the second silicon wafer is eutecticly bonded to the third silicon wafer, wherein the eutectic bonding includes pressing the second silicon wafer to a third silicon wafer. For example, in FIG. 6 the second side 322 of the second substrate 316 has been eutecticly bonded to the third substrate 640. During the eutectic bonding the second substrate 316 is pressed to the third substrate 640.

Figure 13:
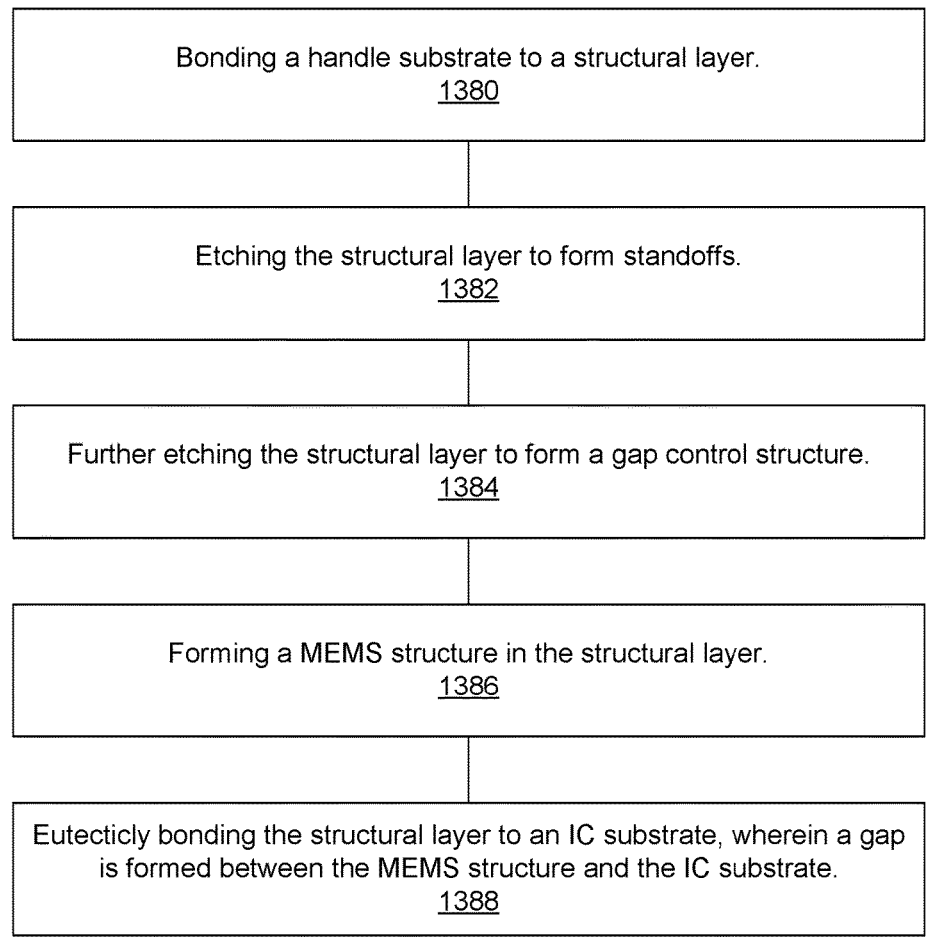
FIG. 13 shows an exemplary flow diagram for forming a gap control structure from a structural layer according to one aspect of the present embodiments.

FIG. 13 an exemplary flow diagram for forming a gap control structure from a structural layer is shown according to one aspect of the present embodiments. At a block 1380, a handle substrate is bonded to a structural layer. For example, in FIG. 9 a first side 920 of the second substrate 916 (e.g. structural layer) may be fusion bonded to the first side 704 of the first substrate 702 (e.g. handle substrate), thereby forming a silicon oxide silicon bond.

At a block 1382, the structural layer is etched to form standoffs. For example, in FIG. 9 standoffs 918 are patterned (e.g. etched) on a second side 922 of the second substrate 916.

At a block 1384, the structural layer is further etched to form a gap control structure. For example, in FIG. 10 the gap control structure 1024 is formed from the second substrate 916 by, for example, further etching of the second substrate 916.

At a block 1386, a MEMS structure is formed in the structural layer. For example, in FIG. 11 first MEMS features 1130 and second MEMS features 1132 are formed in the second substrate 916 (e.g. structural layer) using any suitable fabrication method or combinations of methods.

At a block 1388, the structural layer is eutecticly bonded to an IC substrate, wherein a gap is formed between the MEMS structure and the IC substrate. For example, in FIG. 11 the second side 922 of the second substrate 916 (e.g. structural layer) has been eutecticly bonded to the third substrate 1140 (e.g. IC substrate). The gap may be defined as the gap 1154 between a MEMS features 1130 (e.g. MEMS structure) and the third substrate 1140 (e.g. IC substrate).

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
    forming a cavity in a first side of a first silicon wafer;
    forming an oxide layer on the first side and in the cavity;
    bonding the first side of the first silicon wafer to a first side of a second silicon wafer;
    forming a gap control structure from a second side of the second silicon wafer, wherein the gap control structure and the second silicon wafer are a single continuous component;
    forming a MEMS (micro-electro-mechanical systems) structure in the second silicon wafer; and
    eutecticly bonding a standoff formed from the second side of the second silicon wafer to the third silicon wafer, wherein
        the gap control structure is distinct from the standoff eutecticly bonding the second silicon wafer to the third silicon wafer,
        the eutectic bonding includes pressing the second silicon wafer to a structure formed on a third silicon wafer, and
        the gap control structure remains in contact with the structure on the third silicon wafer after the eutectic bonding.

2. The method of claim 1, wherein the gap control structure includes silicon, silicon nitride, or silicon dioxide.

3. The method of claim 1, wherein the gap control structure prevents a narrowing of a gap between the second silicon wafer and the third silicon wafer beyond the gap control structure during the pressing.

4. The method of claim 1, wherein the pressing includes applying an uneven pressure to the second silicon wafer or the third silicon wafer.

5. The method of claim 1, wherein the eutecticly bonding the second side of the second silicon wafer to the third silicon wafer forms a hermetic seal.

6. The method of claim 5, wherein the gap control structure is inside the hermetic seal.

7. The method of claim 5, wherein the gap control structure is outside the hermetic seal.

8. The method of claim 1, wherein the gap control structure contacts a rigid portion of the third silicon wafer.

9. A method comprising:
    bonding a handle substrate to a structural layer;
    etching the structural layer to form standoffs;
    forming a gap control structure from a second side of the structural layer by etching;
    forming a MEMS (micro-electro-mechanical systems) structure in the structural layer; and
    eutecticly bonding the standoffs formed from the structural layer to an IC (integrated circuit) substrate, wherein
        the gap control structure is distinct from the standoffs eutecticly bonding the structural layer to the IC substrate,
        a gap is formed between the MEMS structure and the IC substrate, and
        the gap control structure remains in contact with a structure formed on the IC substrate after the eutectic bonding.

10. The method of claim 9, wherein the eutecticly bonding the structural layer to the IC substrate includes forming an aluminum-germanium bond.

11. The method of claim 9, wherein the gap control structure maintains a predetermined gap between the MEMS structure and an electrode on the IC substrate.

12. The method of claim 9, wherein the eutecticly bonding includes pressing together the structural layer and IC substrate, and the gap control structure sets a size of the gap.

13. The method of claim 9, wherein the gap control structure prevents a narrowing of the gap during the eutecticly bonding.

14. The method of claim 9, wherein forming the gap control structure includes further etching the structural layer to form the gap control structure.

15. The method of claim 9, wherein the gap control structure contacts a rigid portion of the IC substrate.

* * * * *

UNITED STATES PATENT AND TRADEMARK OFFICE
CERTIFICATE OF CORRECTION

PATENT NO.         : 10,308,507 B2  
APPLICATION NO.    : 15/298499  
DATED              : June 4, 2019  
INVENTOR(S)        : Jong II Shin et al.

Page 1 of 1

It is certified that error appears in the above-identified patent and that said Letters Patent is hereby corrected as shown below:

On the Title Page

In (72), In the listing of Inventors:
Remove "Jong II SHIN" and insert -- Jong IL SHIN -- therefore.

Signed and Sealed this
Fourteenth Day of January, 2020

Andrei Iancu
*Director of the United States Patent and Trademark Office*